(12) United States Patent
Holland

(10) Patent No.: US 6,245,986 B1
(45) Date of Patent: Jun. 12, 2001

(54) THERMOELECTRIC DEVICE FOR PRODUCING AN ELECTRIC CURRENT

(76) Inventor: Beecher J. Holland, 600 Morison Ave., Kingsport, TN (US) 37660

( * ) Notice: Subject to any disclaimer, the term of this patent is extended or adjusted under 35 U.S.C. 154(b) by 0 days.

(21) Appl. No.: 09/487,565

(22) Filed: Jan. 19, 2000

Related U.S. Application Data

(63) Continuation-in-part of application No. 09/196,597, filed on Nov. 20, 1998, now abandoned, which is a continuation-in-part of application No. 09/109,982, filed on Jul. 2, 1998, now abandoned, which is a continuation-in-part of application No. 08/929,310, filed on Sep. 3, 1997, now abandoned, which is a continuation-in-part of application No. 08/789,513, filed on Jan. 27, 1997, now abandoned, which is a continuation-in-part of application No. 08/543,941, filed on Oct. 17, 1995, now abandoned.

(51) Int. Cl.$^7$ .................................................. H01L 35/30
(52) U.S. Cl. ............................................ 136/205; 310/306
(58) Field of Search ..................................... 136/203, 205; 62/3.1, 3.2, 3.3; 310/306; 250/336.1, 338.3

(56) References Cited

U.S. PATENT DOCUMENTS 3,358,162 * 12/1967 Krake et al. ............................. 310/4
4,019,113 * 4/1977 Hartman ................................. 321/1.5

* cited by examiner

*Primary Examiner*—Kathryn Gorgos
*Assistant Examiner*—Thomas H Parsons

(57) ABSTRACT

The present invention is a thermoelectric cell for supplying electric current to an electrical load. Three embodiments of the cell are each comprised of three component means, electron emitter, electron collector/anode and cathode, or three component means, two electron emitters, and an electron collector. A fourth embodiment comprises only an electron collector means and an electron emitter means.

4 Claims, 1 Drawing Sheet

THERMOELECTRIC DEVICE FOR PRODUCING AN ELECTRIC CURRENT

CROSS-REFERENCES TO RELATED APPLICATIONS

This application is a continuation-in-part of U.S. patent application Ser. No. 09/196,597 filed Nov. 20, 1998 (now abandoned) which is a continuation-in-part of U.S. patent application Ser. No. 09/109,982 filed Jul. 2, 1998 (now abandoned) which is a continuation-in-part of U.S. patent application Ser. No. 08/929,310 filed Sep. 3, 1997 (now abandoned) which is a continuation-in-part of U.S. patent application Ser. No. 08/789,513 filed Jan. 27, 1997 (now abandoned) which is a continuation-in-part of U.S. patent application Ser. No. 08/543,941 filed Oct. 17, 1995 (now abandoned).

BACKGROUND OF THE INVENTION

1. Field of the Invention

The present invention pertains to an electric-current-producing thermoelectric device for connection to an electrical load.

2. Description of the Related Art

One of the most nearly related prior art devices, Krake et al, U.S. Pat. No. 3,358,162, requires controlling its two electrodes at different temperatures, a complication which the present invention does not have.

Another related prior art device is, Hartman, U.S. Pat. No. 4,019,113. Hartman apparently requires electrodes comprised of differing metals, a further contrast to the present invention. It appears that previous thermoelectric cells are designed for high temperature operation.

SUMMARY OF THE INVENTION

The present invention, an electrical-current-producing thermoelectric device (better called a thermoelectronic device) producing electrical current as a result of the device absorbing heat from its surroundings is described in four embodiments, the first, the second and the third and fourth embodiments.

Each of the four embodiments has both its anodic and cathodic means associated with the temperature of their surroundings, resulting in both means tending to the temperature of their surroundings. Neither anodic nor cathodic means is deliberately controlled at a temperature different from the other.

Each of the three embodiments is comprised of three separate component means although there may be adhesion of contacting components from different modes of manufacture. It is essential that contacting components be firmly in contact. Also, the electrodes (anode and cathode) of the present invention may be comprised of the same material.

In the instance of the first embodiment, the three components constituting a thermoelectric cell are an anodic means (the electron collector), a cathodic means, and an electron emitter means, the emitter means, (the emitter means displaying thermally-induced electron emission).

In the instance of the second embodiment, the three components constituting a thermoelectric cell are two separate electron emitter means (thermally induced) and an electrically conductive electron collector means common to both the emitter means.

The first embodiment comprises at least one thermoelectric cell comprised in part of material which displays thermally-induced electron emission, the emitter means. The first embodiment further comprises an anodic means and a smaller cathodic means, each of which is electrically conductive, the anodic means being the primary electron collector of emitted electrons so that the anodic means displays a higher potential than does the cathodic means, the anodic and cathodic means being firmly against the emitter means and in electrical contact with the emitter means, and the area of contact of the anodic means with the emitter means is greater than the area of contact of the cathodic means with the emitter means. A conductor lead, not a part of cell design, extends from electrical contact with each of the anodic and cathodic means on FIG. 1 herein and serves to point out the efficacy of having anodic means, cathodic means and conductor leads comprised of the same material for cells in series.

The second embodiment comprises at least one thermoelectric cell comprised of three components, two electron emitter means (displaying thermally-induced electron emission), a smaller and a larger electron emitter means, and of an electrically conductive electron collecting means, the collector, common to both the emitter means. The above two emitter means are in firm and electrical contact with the electron collector means so as to establish an anodic means on one area of the electron collecting means, the area contacting the larger emitter means and a cathodic means on another area of the electron collecting means, the area contacting the smaller emitter means. Both anodic and cathodic means, that is the collector means, are associated with the temperature of their surroundings. A conductor lead, not a part of cell design, extends from electrical contact with each of the cathodic means and anodic means on FIG. 2 herein and serves to point out the efficacy of having cathodic means, anodic means and conductor leads comprised of the same material for cells in series.

The third embodiment is like the first embodiment wherein the anodic means is essentially immersed in the emitter means. The emitter means is the third embodiment may be comprised partially or entirely of a metal salt or oxide. Metal salts with which cells have been built are not normally electrically conductive but make cells apparently electrically conductive because electrons returning through a cell's cathode act to replace diminished electrons in the cell's emitter so that the cell's emitter has in effect some electrical conductivity.

It has been experienced that a ratio of the length of the anodic means to the width of the anodic means can usually be determined experimentally which optimizes cell output for a cell of specific materials and construction.

The three embodiments shown herein are more simple than prior art devices.

Testing has indicated that each of the three embodiments may at times indicate reversed electrical polarity. Polarity of the cells is as shown by testing with a meter.

Polarity of a cell like the present invention appears more nearly constant if electrical impedance and resistance within the cell, that is between the anode and cathode, are less than the electrical impedance and resistance in a circuit external to the cell. The electrical resistance appears to have two different components, and there should be less of each component within the cell than in a circuit external to said cell, that of conventional resistance accompanied by a potential drop in the direction of current flow, and that of deterring migration of electrons from electron void to electron void in a conductor without a potential drop in the direction of flow and possibly against potential rise in the direction of flow as appears to exist from the cathode to anode within a cell like the present invention. Perhaps the electron migration may be compared to the rise of lamp oil in a wick, wherein "surface tension" is supplied by anode depletion of emitter electrons and attendant attraction of voids for electrons. Resistance to deter the electron migration probably requires conductor material of relatively higher work function compared to common conductors. Resistance to deter the migration was apparently obtained in tests of the present invention by using a voltmeter in series in circuits external to cells under test. The volt meter's role in deterring "migration" has since been accomplished with high resistance/low wattage resistance in parallel with a capacitor.

The cells usually require time to reach equilibrium.

Experience has shown that the present invention can be used as an electrical resistor when arranged to oppose a current.

The only limitations on the temperature range over which the cells of the three embodiments will perform are that high temperature must not be high enough to damage the components of the cells (for example, reach the melting point of a component but not limited to such a situation) and low temperature must be high enough for the thermally-induced voltage and amperage from the cell to be useful, which depends on the application. Some embodiments of the present invention have been demonstrated functional at temperatures ranging from 29° F. to 150° F.

A fourth embodiment is a cell like the third embodiment, FIG. 3, wherein an electron collecting means extends full length of an emitter means and the end of the electron collecting means which is an anode terminal is determined as that end nearest "electron migration" deterring resistance and impedance in a circuit external to the cell. The fourth embodiment has been shown functional. It appears that assemblies of the electron collecting means and the emitter means can be placed in series with "electron migration" deterring means at one end of the series in a circuit and the assemblies will act additively. Extension of the collector means yields both an anode terminal at one extension and a cathode terminal at the other extension.

The object of the present invention is to provide an effective, versatile, economical source of electric power. The present invention is seen as possibly usable for common batteries, individual residence and business power plants, hybrid fuel and electric vehicles, cooling, electronic amplifications, power transmission, and as an electrical resistor.

It appears that for a device like the present invention, amperage and voltage are characteristic of materials of construction and of construction. It also appears that possible Carnot efficiency is on the order of 90%. Several models of the four embodiments have been tested.

BRIEF DESCRIPTION OF THE DRAWINGS

The three preferred embodiments of the present invention will herein be described by drawings for clarification of the design and function of the embodiments.

FIG. 1 is a schematic view of the first embodiment showing one thermoelectric cell. Item 1 which is an electron emitting material (the emitter means) is a layer comprised of graphite cloth. The small or part of item 1 provides within-cell electrical resistance. The smaller part of item 1 can be partially replaced (leaving the part of graphite cloth in contact with the cathodic means item 3) by a resistor means or lead line. Items 2 and 3 are pieces of aluminum foil and are comprised only of the parts of respective aluminum foil pieces which are in contact with the emitter item 1 and are the anodic and cathodic means respectively. Items 4 and 5 are conductor leads for items 2 and 3 respectively and are comprised of only parts of said respective aluminum foil pieces which do not contact the emitter item 1 and are continuous with items 2 and 3 respectively and are not part of the cell design.

The first embodiment appears largely additive of both voltage and amperage for cells in series.

Figure 2:
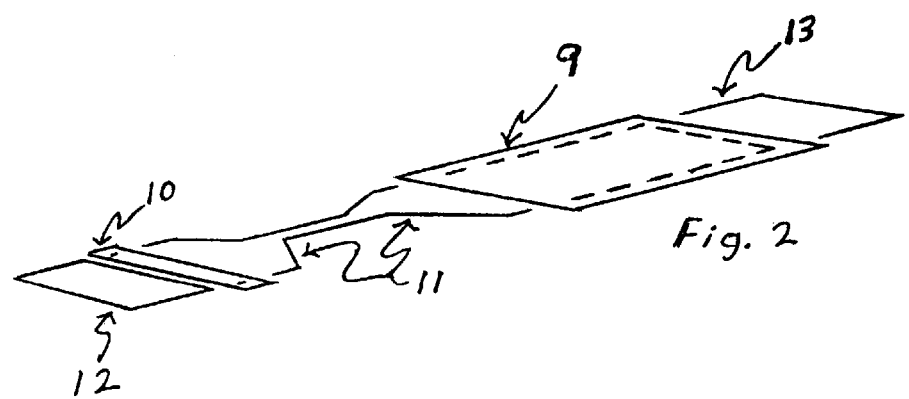
FIG. 2 is a schematic of the second embodiment showing one thermoelectric cell.

FIG. 2 is a schematic of the second embodiment showing one thermoelectric cell, wherein item 9 and item 10 represent two pieces of graphite cloth as emitter means establishing an anodic means, and as emitter means establishing a cathodic means respectively by contact with aluminum sheet item 11, the collector means. Items 13 and 12 represent two pieces of aluminum sheet conductor leads for anodic and cathodic means, respectively, and are not part of said cell design and which are continuous with item 11. Resistance between anodic means under item 9 and cathodic means under item 10 is increased by the narrowed section shown in the collector means item 11. Placing a resistor means, of specific resistance value appropriate to the wattage passing through the cell as determined by the application of the cell, or lead line between anodic means and cathodic means as a part of the collector means item 11 would be an acceptable alternative to narrowing item 11.

The second embodiment appears largely additive for cells in series.

Figure 1:
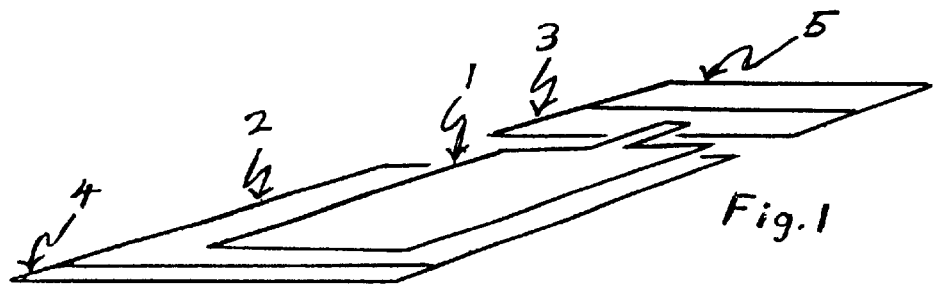
FIG. 1 is a schematic of the first embodiment showing one thermoelectric cell.

It may be possible to achieve embodiments similar to FIGS. 1 and 2 by printing means.

Figure 3:
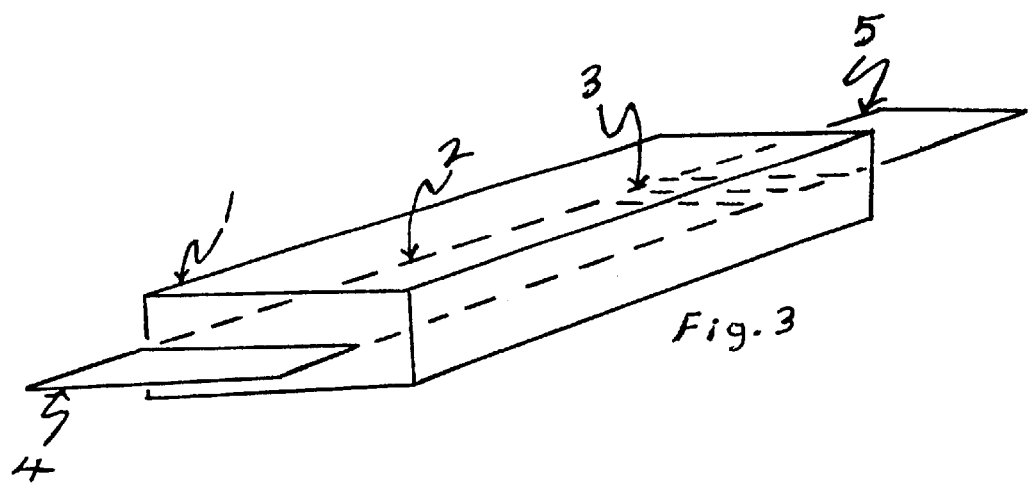
FIG. 3 is a schematic of the third embodiment showing one thermoelectric cell.

FIG. 3 is a schematic view of the third embodiment showing one thermoelectric cell. Item 1 which is an electron-emitting material (the emitter means) is a layer of powdered lubricating graphite and of common non-iodized table salt, NaCl, the graphite extending from item 4 to the opposite end of item 2 and the salt being the remainder of item 1. The salt adds within-cell resistance and is an emitter. Items 2 and 3 are pieces of aluminum sheet metal and are comprises only of the parts of respective aluminum pieces which are in contact with the emitter item 1 and are the anodic and cathodic means respectively. Items 4 and 5 are conductor leads for items 2 and 3 respectively and are comprised of only parts of said respective aluminum metal pieces which do not contact the emitter item 1 and are continuous with items 2 and 3 respectively and are not part of said cell design.

The third embodiment appears largely additive of voltage and amperage for cells in series.

DESCRIPTION OF THE PREFERRED EMBODIMENTS

The first embodiment shown in FIG. 1 when absorbing heat from its surroundings develops, after closing a circuit external to said cell, a difference in electric potential between the anodic means item 2 and the cathodic means item 3 because item 2 has a larger area of contact with emitter means item 1 than does item 3 so that item 2 intercepts more electrons than does item 3 and therefore item 2 displays greater potential than item 3 and item 2 is the anodic means and item 3 is the cathodic means. As a result of the potential difference between said anodic and cathodic means, connection of the two conductor leads items 4 and 5 to an electrical load results in a direct current through the connecting circuitry.

Function of the second embodiment, FIG. 2 is like that of FIG. 1 except for item numbers. Potential difference develops between anodic means under item 9 and cathodic means under item 10 after anodic means and cathodic means are connected by circuitry and the device absorbs heat from its surroundings because emitter means item 9 has a larger area of contact with collector means item 11 than does the smaller emitter item 10 and the anodic means under item 9 intercepts more electrons than does the cathodic means under item 10 and current flow through the circuitry. The narrowed part of item 11 serves to increase electrical resistance within the cell.

Description of FIG. 3 embodiment function is the same as for FIG. 1.

It is noted that in testing cells of the present invention, touching an electrical conductor of the cell/circuit while under a fluorescent light may disturb the cell and grounding any of the electrical conductors of the cell/circuit while under a fluorescent light may greatly increase the indicated output.

I claim:

1. An electric-current producing thermoelectric device, comprising at least one thermoelectric cell comprised of electron emitter means, including resistor means between anodic and cathodic means, displaying thermally-induced electron emission, and of electrically conductive electron-collecting said anodic means and of electrically conductive said cathodic means, in electrical contact with said emitter means wherein said anodic and said cathodic means are firmly against said emitter means wherein said anodic means has a larger area of contact with said emitter means than does said cathodic means and said anodic means and said cathodic means are each associated with the temperature of their surroundings and polarity of said cell is as shown by testing.

2. An electric-current-producing thermoelectric device according to claim 1 wherein said anodic means is essentially immersed in said emitter means.

3. An electric-current-producing thermoelectric device according to claim 2 wherein an electron controlling means extends the full length of an emitter means at both ends of said emitter means and wherein an end of said collecting means being an anode being determined as that end nearest electron migration deterring resistance and impedance in a circuit external to said cell.

4. An electric-current-producing thermoelectric device comprising at least one thermoelectric cell comprised of an electrically conductive, electron collecting means, including resistor means, the collector, common to two electron emitter means, a smaller and a larger electron emitter means, each displaying thermally-induced electron emission, wherein said resistor means is between said two electron emitter means and said two electron emitter means are in electrical and firm contact with said collector means and said larger electron emitter means has a larger area of contact with said electron collector means than does said smaller electron emitter means and said two electron emitter means and said electron collector means, including said anodic means and said cathodic means, are associated with the temperature of their surroundings and polarity of said cell is as shown by testing.

\* \* \* \* \*

UNITED STATES PATENT AND TRADEMARK OFFICE
CERTIFICATE OF CORRECTION

PATENT NO. : 6,245,986 B1
DATED : June 12, 2001
INVENTOR(S) : Beecher J. Holland It is certified that error appears in the above-identified patent and that said Letters Patent is hereby corrected as shown below:

Column 3,
Line 1, reads "to exist from" should read -- to exist --
Line 14, reads "capacitor." should read -- capacitor --.
After line 35, reads "functional." should read -- functional --.
Line 39, reads "additively." should read -- additively --.

Column 4,
Line 2, reads "small or" should read -- smaller --.
Line 47, reads "comprises" should read -- comprised --.

Column 6,
Line 10, reads "controlling" should read -- collecting --.

Signed and Sealed this

Fifteenth Day of January, 2002

*Attest:*

JAMES E. ROGAN
*Attesting Officer*  *Director of the United States Patent and Trademark Office*